United States Patent
Hopkins (10) Patent No.: US 10,903,618 B2
(45) Date of Patent: Jan. 26, 2021

(54) FIXTURE ASSEMBLY FOR TESTING EDGE-EMITTING LASER DIODES AND TESTING APPARATUS HAVING THE SAME

(71) Applicant: Chroma Ate Inc., Taoyuan (TW)

(72) Inventor: James E. Hopkins, Chandler, AZ (US)

(73) Assignee: CHROMA ATE INC., Taoyuan (TW)

( * ) Notice: Subject to any disclaimer, the term of this patent is extended or adjusted under 35 U.S.C. 154(b) by 104 days.

(21) Appl. No.: 16/358,812

(22) Filed: Mar. 20, 2019

(65) Prior Publication Data

US 2020/0303895 A1 Sep. 24, 2020

(51) Int. Cl.
*H01S 5/00* (2006.01)
*G01R 31/26* (2020.01)
*H01S 5/024* (2006.01)

(52) U.S. Cl.
CPC ........ *H01S 5/0014* (2013.01); *G01R 31/2635* (2013.01); *H01S 5/024* (2013.01)

(58) Field of Classification Search
CPC .... H01S 5/0014; H01S 5/024; H01S 5/02264; H01S 5/02236; H01S 5/02248; G01R 31/2635; G01R 1/0408; G01R 31/01; G01J 1/02; G01J 1/0223; G01J 1/4228; G01J 2001/0481; G01J 2001/4247; G01J 2001/4252; G01J 2005/608; G01J 3/51; H01L 2224/48091; H01L 2924/00; G02B 6/4201; G02B 6/4243; G02B 6/4245; G02B 6/4256

See application file for complete search history.

(56) References Cited

U.S. PATENT DOCUMENTS

| 5,084,886 A | * | 1/1992 | Martin | H01S 3/042 372/36 |
| 5,909,524 A | * | 6/1999 | Tabuchi | G02B 6/423 385/14 |
| 6,061,374 A | * | 5/2000 | Nightingale | H01S 5/02208 372/50.21 |

(Continued)

OTHER PUBLICATIONS

Famenini et al. ;"Integration of Edge-Emitting Laser Diodes With Dielectric Waveguides on Silicon"; IEEE Photonics Technology Letters, vol. 24, No. 20, Oct. 15, 2012. (Year: 2012).*

*Primary Examiner* — Mohamed K Amara
(74) *Attorney, Agent, or Firm* — McClure, Qualey & Rodack, LLP (57) ABSTRACT

A fixture assembly having a base, an upper cover and a latch mechanism for testing an edge-emitting laser diode and a testing apparatus having the same are provided. The base includes a pocket, and a transmission cavity in communication with and orthogonal to the pocket. The upper cover includes a body, an abutting block and a pressing member. The abutting block having an electrical contact interface is engageable with the body for slidable movement with respect to the body. The latch mechanism is disposed on the upper cover, and may selectively connect or disconnect the upper cover to or from the base. When the latch mechanism is operated to connect the upper cover to the base, the pressing member applies a force through the abutting block on the edge-emitting laser diode received in the pocket, and the edge-emitting laser diode emits the laser for inspection through the transmission cavity.

10 Claims, 5 Drawing Sheets

(56) References Cited

U.S. PATENT DOCUMENTS

| | | | | |
|---|---|---|---|---|
| 6,784,511 B1* | 8/2004 | Kunihara | H01S 5/02228 | 257/433 |
| 7,170,919 B2* | 1/2007 | Zamel | H01S 3/025 | 372/69 |
| 7,189,012 B2* | 3/2007 | Kuhara | G02B 6/4201 | 372/43.01 |
| 7,215,690 B2* | 5/2007 | Valiente | H01S 5/02264 | 372/36 |
| 7,280,724 B2* | 10/2007 | Yoshikawa | G02B 6/4201 | 385/52 |
| 7,411,211 B1* | 8/2008 | Yamazaki | H01L 27/124 | 257/59 |
| 7,777,247 B2* | 8/2010 | Loh | H01L 33/486 | 257/100 |
| 7,777,421 B2* | 8/2010 | Mishimagi | H05B 45/37 | 315/209 R |
| 7,968,362 B2* | 6/2011 | Takahashi | C23C 16/301 | 438/47 |
| 8,235,605 B2* | 8/2012 | Kim | G02B 27/145 | 385/92 |
| 8,462,593 B1* | 6/2013 | Komura | G11B 5/6088 | 369/13.33 |
| 8,475,923 B2* | 7/2013 | Katayama | H01L 21/268 | 428/408 |
| 2002/0005522 A1* | 1/2002 | Miyokawa | G02B 6/4248 | 257/79 |
| 2003/0026554 A1* | 2/2003 | Jin | G02B 6/4249 | 385/89 |
| 2003/0072538 A1* | 4/2003 | Jin | G02B 6/4225 | 385/89 |
| 2003/0091301 A1* | 5/2003 | Lee | G02B 6/4277 | 385/89 |
| 2004/0082112 A1* | 4/2004 | Stephens | H01S 5/02423 | 438/122 |
| 2005/0047460 A1* | 3/2005 | Go | H01S 5/02212 | 372/43.01 |
| 2006/0077382 A1* | 4/2006 | Wang | G01N 21/658 | 356/301 |
| 2007/0007540 A1* | 1/2007 | Hashimoto | H01L 33/642 | 257/94 |
| 2007/0019960 A1* | 1/2007 | Kuwata | G02B 6/4206 | 398/118 |
| 2007/0115617 A1* | 5/2007 | Schulte | H01S 5/4025 | 361/671 |
| 2007/0278666 A1* | 12/2007 | Garcia | H01L 23/3677 | 257/707 |
| 2008/0006202 A1* | 1/2008 | Hirano | B01L 3/50853 | 118/60 |
| 2010/0044741 A1* | 2/2010 | Okimura | F21V 19/0055 | 257/99 |
| 2011/0133236 A1* | 6/2011 | Nozaki | H01L 33/642 | 257/98 |
| 2011/0316038 A1* | 12/2011 | Hirotsuru | C04B 41/5155 | 257/99 |
| 2013/0058367 A1* | 3/2013 | Grove | H01S 5/024 | 372/36 |
| 2015/0332717 A1* | 11/2015 | Hara | G11B 5/314 | 369/13.33 |
| 2018/0191131 A1* | 7/2018 | Lin | H01S 5/02469 | |
| 2018/0316160 A1* | 11/2018 | Raring | H01S 5/005 | |
| 2020/0233292 A1* | 7/2020 | Rudy | G03B 21/2033 | |
| 2020/0303894 A1* | 9/2020 | Hopkins | H01S 5/183 | |
| 2020/0303895 A1* | 9/2020 | Hopkins | G01R 31/2635 | |

* cited by examiner

FIXTURE ASSEMBLY FOR TESTING EDGE-EMITTING LASER DIODES AND TESTING APPARATUS HAVING THE SAME

BACKGROUND OF THE INVENTION

1. Field of the Invention

The present invention relates to a fixture assembly for testing edge-emitting laser diodes and a testing apparatus having the fixture assembly, in particular a fixture assembly for securing and testing edge-emitting laser diodes and a testing apparatus for performing optical and electrical test of the laser diodes.

2. Description of the Related Art

As a side/edge-emitting laser diode has the following characteristics: linear propagation, micro light-spots (from several um~), monochromaticity, high optical density, and coherent, it can be used in many applications which include sensors, communication, lighting, photographic, data storage etc. In particular, CD/DVD/Blu-ray disc reading/recording, photographic/printing of laser printer and multi function peripheral (MFP), fiber optic communication, lighting for laser microscope and laser level, distance detection and smoke detection.

Whether it is portable consumer electronics or industrial applications, there has been a growing tendency towards the minimization of the size of the electronics, which will inevitably restrict the sizes of the electronic components such as semiconductor wafers and laser diodes, With the reduction in size the connections available for temporary contact for testing gets smaller as well. As the connections occupy the surface area of the component to be tested, only a small portion of the surface area remains as the surface for thermal contact. In addition, fine pitch spring pins do not provide the sufficient force to make good thermal contact.

Some examples of art pertinent to the field are Chinese Utility Model Patent Publication No. CN201974446U and Chinese Invention Patent Publication No. CN106996990A. However, existing art including the above patents fail to overcome the drawbacks as mentioned above, and there are still rooms for improvement. For example, UM Publication No. CN201974446U entitled "Test fixture for power of laser diode chip", it simply discloses that the carrier grooves and the chip slots are disposed on the fixture, and a photodetector is used to test the components to be tested in the carrier grooves and chip slots. As such, there is no means for holding the components to be tested for precise positioning, and sufficient electrical contact between the components to be tested and the spring pins is not assured.

As to Invention Publication No. CN106996990A entitled "Test fixture for simultaneously testing multiple multi-pin laser devices", although means for clamping the components to be tested is disclosed therein, the mechanism of the means is too complicated and clamping has to be made by manually turning the handle. Further, the publication does not suggest the function of providing a burn-in test.

SUMMARY OF THE INVENTION

The primary object of the present invention is to provide a fixture assembly for testing edge-emitting laser diodes, and a testing apparatus having the fixture assembly. The fixture assembly firmly clamps the laser diodes to accurately position the same, so that the testing apparatus is accessible to the beam emissions to each of the laser diodes, thereby ensuring all the pads of the laser diodes made sufficient electrical contact with the spring pins/probes.

A further object of the present invention is to provide a fixture assembly for testing edge-emitting laser diodes, which can be coupled with a mating contactor attached to a test resource. The coupling can be universal between equipment, thus providing repeatable handling of the fixture and not the components to be tested. In addition, unpackaged laser diodes are fragile and easily damaged by handling. Placing them into a fixture will reduce the chances that the delicate die and pads coming into contact with external devices. The laser diodes are protected from handling as they remain in the fixture throughout other factory processes or tests.

To achieve the above object, a fixture assembly for testing at least one edge-emitting laser diode comprising a base, an upper cover, and a latching mechanism is provided. The base includes at least one pocket and at least one transmission cavity in communication with and orthogonal to the pocket. The upper cover includes a body, at least one abutting block engageable with the body for slidable movement with respect to the body, and at least one pressing member disposed in the body. The abutting block includes at least one electrical contact interface. The latch mechanism is disposed on at least one of the base and the upper cover, and may selectively connect or disconnect the upper cover to or from the base. When the latch mechanism is operated to connect the upper cover to the base, the pressing member applies a force through the abutting block on the edge-emitting laser diode received in the pocket.

Accordingly, when the locking mechanism fastens the upper cover to the base, the pressing member presses on the abutting block, so that the abutting block and the pocket jointly hold and position the laser diodes to be tested. In addition, during testing, the laser light emitted by the edge-emitting laser diode can be emitted through the transmission cavity.

To achieve the foregoing object, the present invention provides a fixture assembly for testing edge-emitting laser diodes. The edge-emitting laser diode comprises a contact surface, and an emitting surface having a light emission area. The fixture assembly primarily includes a base having at least one pocket for receiving the edge-emitting laser diode, and at least one transmission cavity in communication with and orthogonal to the pocket.

The upper cover has a body, an abutting block, and a pressing member. The body has a groove for slidably receiving the abutting block. The pressing member is disposed between the body and the abutting block. The abutting block includes at least one electrical contact interface. The latch mechanism is disposed on at least one of the base and the upper cover, and is configured to selectively connect or disconnect the upper cover to or from the base. When the latch mechanism is operated to connect the upper cover to the base, the pressing member applies a force through the abutting block on a contact face of the edge-emitting laser diode, which is in contact with the at least one electrical contact interface. The transmission cavity of the base exposes at least a portion of the light emission area of the edge-emitting laser diode.

To achieve the foregoing object, the present invention provides a testing apparatus comprising a power supply, a fixture assembly as stated hereinbefore, a source measurement module, and a main controller. The source measurement module is configured to activate the edge-emitting laser diode, and the controller configured to undertake the electrical test and optical test of the edge-emitting laser diode.

DESCRIPTION OF THE PREFERRED EMBODIMENTS

The present invention is related to a fixture assembly for testing edge-emitting laser diodes and a testing apparatus having the fixture assembly. In the description, similar elements will be denoted by the same reference numerals. In addition, the drawings of the present invention are only intended to be illustrative, and are not necessarily drawn to scale, and all details are not necessarily shown in the drawing.

Figure 1:
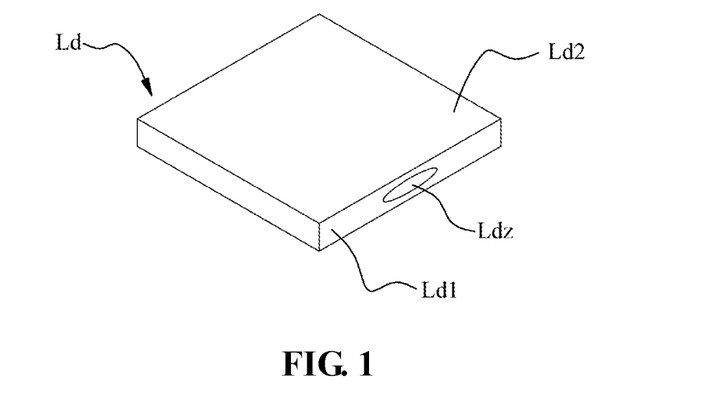
FIG. 1 is a perspective view schematically illustrating an edge-emitting laser diode.

FIG. 1 is a perspective view schematically illustrating an edge-emitting laser diode Ld, which generally includes an emitting surface Ld1 and a contact surface Ld2, wherein the emitting surface Ld1 includes a light emission area Ldz which emits the laser light. In addition, a plurality of electrical contacts (not shown) which serves as a medium for electrically connecting the diode chips with the circuit board are disposed on the contact surface Ld2.

Figure 2:
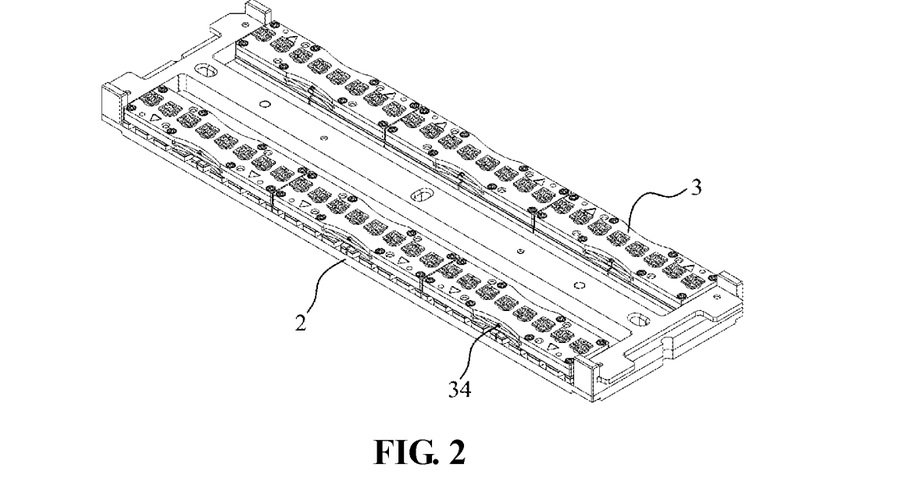
FIG. 2 is a perspective view showing a preferred embodiment of the fixture assembly according to the present invention.
Figure 3:
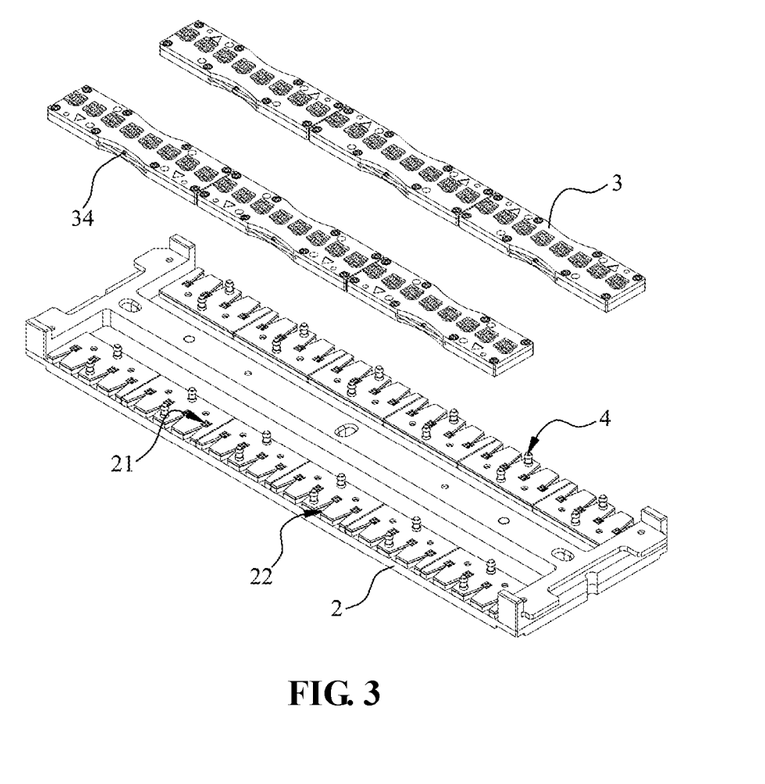
FIG. 3 is a perspective view of the fixture assembly of the present invention showing the upper cover being separated from the base.

With reference now to FIG. 2 which is a perspective view showing a preferred embodiment of the fixture assembly according to the present invention; and FIG. 3 which is a perspective view of the fixture assembly of the present invention showing the upper cover being separated from the base. As illustrated in the figures, the fixture assembly according to this embodiment mainly includes a base 2, an upper cover 3 and a latching mechanism 4. The base 2 includes a number of pockets 21, each of which for receiving an edge-emitting laser diode Ld as shown in FIG. 1.

Figure 4:
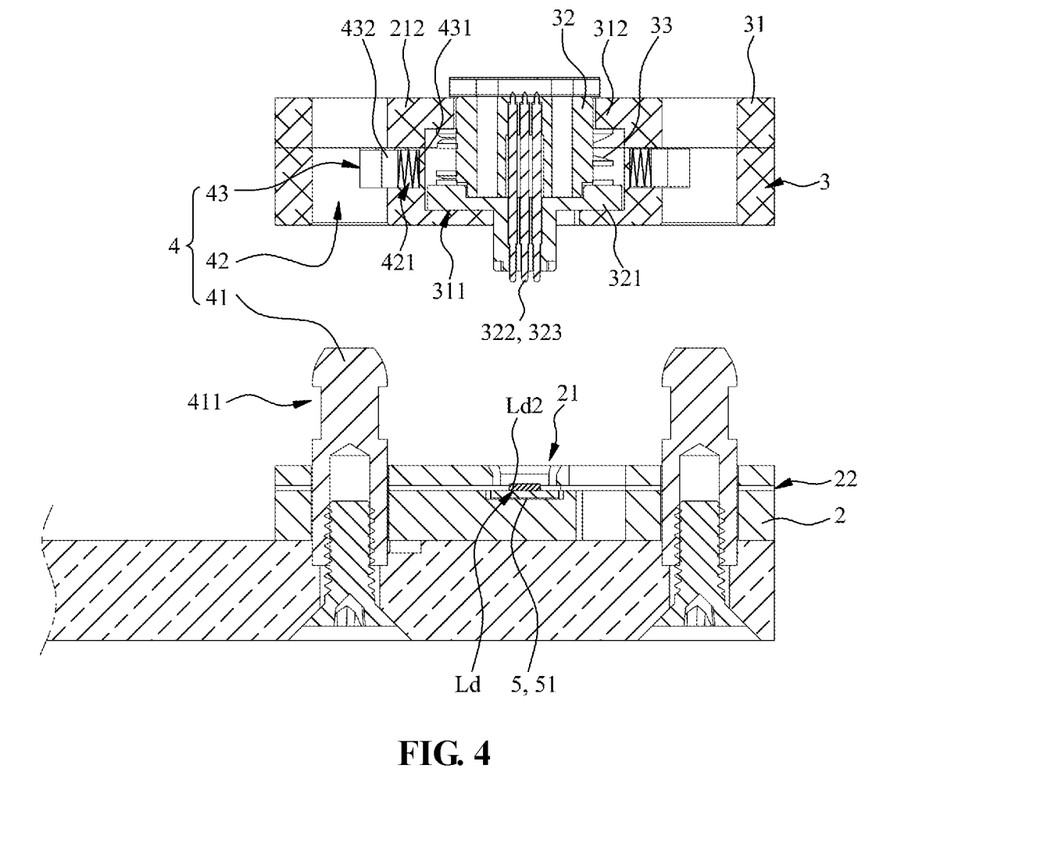
FIG. 4 is a cross-sectional view of the fixture assembly of the present invention showing the upper cover being separated from the base.

FIG. 4 is a cross-sectional view of the fixture assembly of the present invention showing the upper cover being separated from the base. As shown in the figure, the base 2 is provided with a number of transmission cavities 22, each being in communication with and orthogonal to a respective pocket 21. In the present embodiment, the pocket 21 is longitudinally arranged, while the transmission cavity 22 is laterally arranged. A temperature control unit 5 is disposed in the pocket 21 for heating or cooling the edge-emitting laser diode Ld.

As the fixture assembly of this embodiment is intended for burn-in test, the temperature control unit 5 adopts a thermal pedestal 51 which performs heating via the base 2. Further, the base 2 is connected with a heating and cooling chuck (not shown). In other words, in this embodiment, both the thermal pedestal 51 and the base 2 are directed to temperature transfer platforms. However, the present invention is not limited thereto, and other heating or cooling modules are also applicable.

According to this embodiment, the upper cover 3 includes a body 31, a plurality of abutting blocks 32, and a plurality of pressing members 33 disposed in the body 31. Each abutting block 32 having an electrical contact interface 322 is engageable with the body for slidable movement with respect to the body 31. In this embodiment, the electrical contact interface 322 comprises a plurality of probes 323 projecting from the lower face of the abutting block 32 to electrically connect with the contact surface Ld2 of the edge-emitting laser diode Ld.

Further, the body 31 has a plurality of through holes 311 for slidably receiving respective abutting blocks 32. A stop 321 protrudes radially outwards from each abutting block 32. A locking portion 312 is provided in each through hole 311 by protruding radially inward from the through hole. In this embodiment, the pressing member 33 is formed of a compression spring which is arranged in the through hole 311 in between the locking portion 312 and the stop 321. The compression spring not only provides restoring function for the abutting block 32 when slidably moved, but also provides a tensile force that may act as a downward pressing force for the abutting block 32 when urged by the abutting block 32.

Further, each of the latching mechanisms 4 includes a pair of opposed latch posts 41, a pair of insertion slots 42 and a pair of latch members 43. The pair of opposed latch posts 41 extends upwardly from the upper surface of the base 2, and is arranged on the respective sides of the pockets 21. Each latch post 41 includes an annular notch 411 at the upper edge. The pair of insertion slots 42 is arranged on the upper cover 3 and provided on both sides of the through holes 311. Each insertion slot 42 has a receiving slot 421. The insertion slot 42 is in communication with and orthogonal to the receiving slot 421.

Further, each latch member 43 is received in the respective receiving slot 42, and includes a clamping block 432 and a spring 431 that are received in the receiving slot 421. The spring 431 is arranged to bias the clamping block 432. In other words, the clamping block 432 is biased by the spring 431 to slidably move between the receiving slot 421 and the notch 411.

Figure 5:
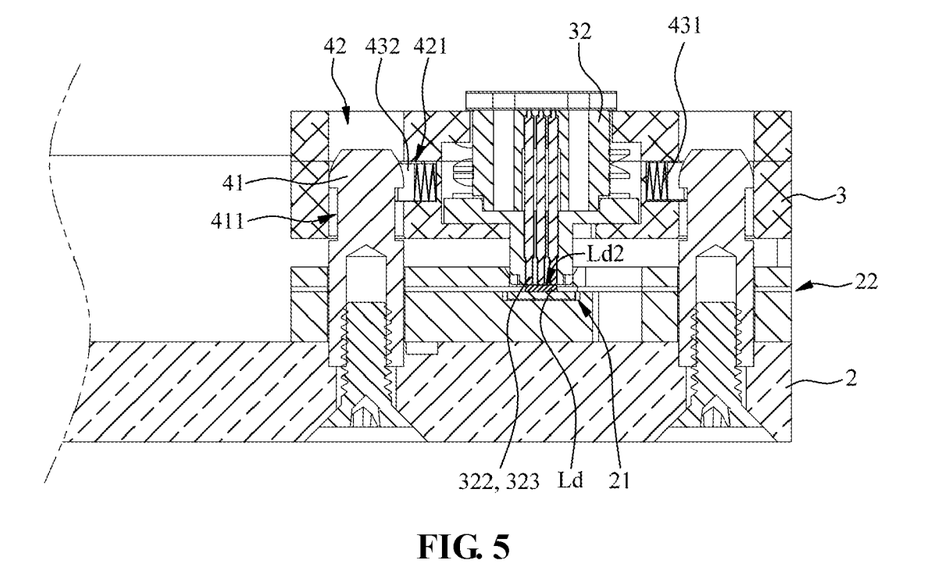
FIG. 5 is a cross-sectional view of the fixture assembly of the present invention showing the upper cover and the base in the process of engaging.
Figure 6:
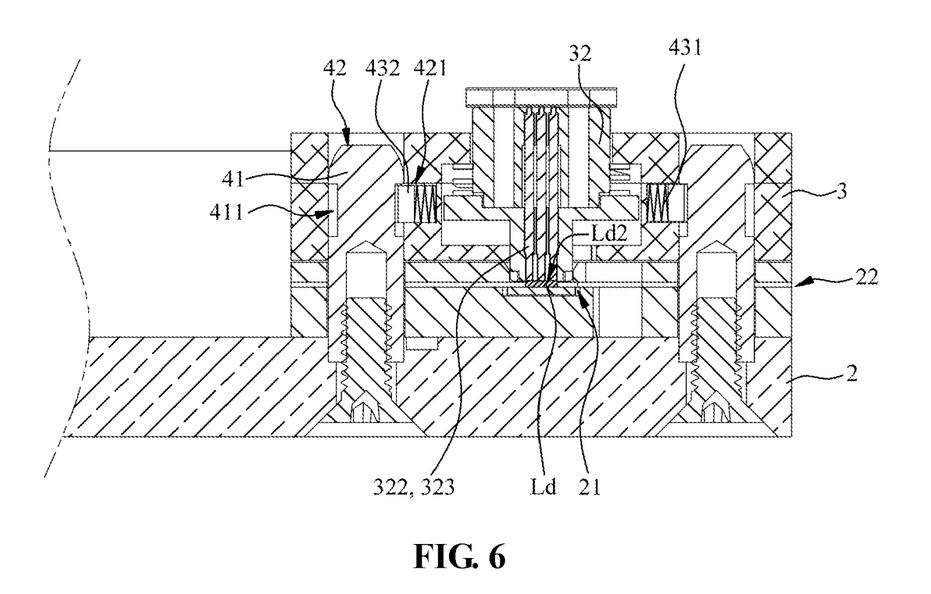
FIG. 6 is a cross-sectional view of the fixture assembly of the present invention showing the upper cover being attached to the base.

The engagement between the base 2 and the upper cover 3 shall be explained hereinafter with reference to FIGS. 4, 5 and 6. FIG. 4 is a cross-sectional view of the fixture assembly of the present invention showing the upper cover 3 being separated from the base 2. FIG. 5 is a cross-sectional view of the fixture assembly of the present invention showing the upper cover 3 and the base 2 in the process of engaging. FIG. 6 is a cross-sectional view of the fixture assembly of the present invention showing the upper cover 3 being attached to the base 2.

To connect the base 2 with the upper cover 3, the upper cover 3 is gradually lowered to approach the base 2. The insertion slot 42 of the upper cover 3 receives the latch post 41 until the notch 411 of the latch post 41 matches the receiving slot 421 of the upper cover 3. At this time, the spring 431 urges the clamping block 432 to slide out of the receiving slot 421 to be locked between the receiving slot 421 and the notch 411. The latch member 43 then fastens the latch post 41 to secure the connection between the base 2 and the upper cover 3. This completes the locking action.

With reference to FIG. 5, when the latch post 41 is fitted into the insertion slot 42 of the upper cover 3, the probes 323 at the lower end surface of the abutting block 32 will urge against the contact surface Ld2 of the edge-emitting laser diode Ld. Further, as the upper cover 3 is gradually lowered, the pressing member 33 is gradually pressed to generate a downward pressing force that is applied onto the edge-emitting laser diode Ld through the abutting block 32. It is to be noted that although this pressing force is a discrete force for individual objects to be tested, each object to be tested in the assembly will get compliant force across the assembly for uniform and sufficient thermal and electrical contact.

That is to say, by applying the downward pressing force onto the abutting block 32 through the pressing member 33 ensures the electrical contact interface 322 making sufficient contact with the contact surface Ld2 of the edge-emitting laser diode Ld, and ensures the abutting block 32 and the pockets 21 cooperate with each other to secure the edge-emitting laser diode Ld. Besides, the light emission area Ldz of the emitting surface Ld1 aligns with the transmission cavity 22 of the base 2, so that the transmission cavity 22 fully exposes the light emission area Ldz. When a test is initiated, the laser light emitted by the edge-emitting laser diode Ld can be emitted through the transmission cavity 22, as shown in FIG. 6. It is to be noted that as far as the test is concerned, the maximum light emission amount is considerably important. As such, the design of the interface or opening angle of the transmission cavity 22 must take into account the maximum divergence angle of the light emission area Ldz of the light-emitting surface Ld1 to avoid the laser light emission from being blocked.

Referring again to FIGS. 2 and 3, each latch mechanism 4 according to this embodiment further includes a button 34 that is connected to a clamping block 432 and is disposed on the upper cover 3. After the test is completed, simply pressing the button 34 of the upper cover 3 would disengage the clamping block 432 from the notch 411 of the latch post 41, thereby releasing the locking between the upper cover 3 and the base 2. The upper cover 3 can then be easily separated from the base 2.

Figure 7:
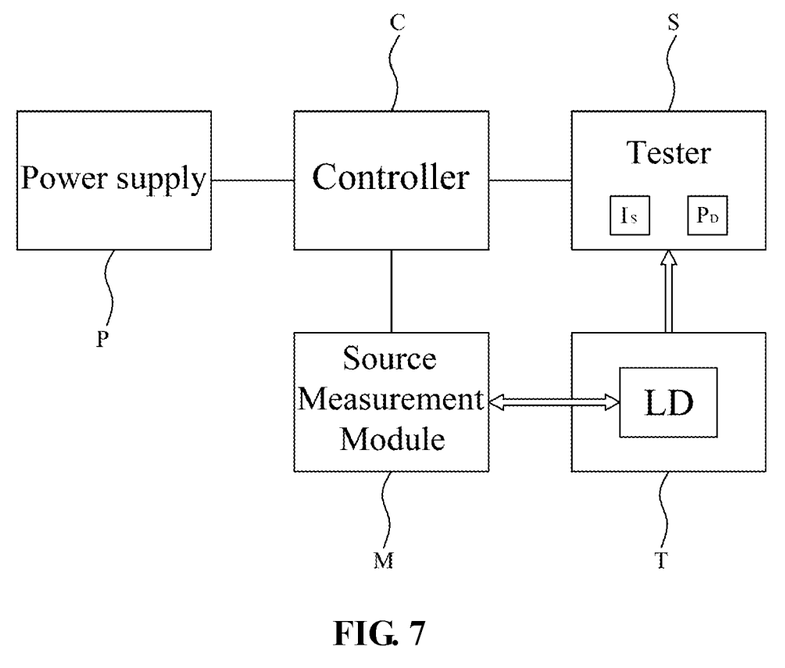
FIG. 7 is a system framework of a preferred embodiment of the testing apparatus according to the present invention.

FIG. 7 is a system framework of a preferred embodiment of the testing apparatus according to the present invention. The testing apparatus comprises a power supply P, a fixture assembly T for testing edge-emitting laser diodes as stated hereinbefore, a source measurement module M, a test device S and a main controller C. The power supply P, the test device S, and the source measurement module M are electrically connected to the main controller C. The test device S corresponds to the transmission cavity 22 of the base 2.

When the latch mechanism 4 is operated to connect the base 2 to the upper cover 3, that is, when the electrical contacts of the contact surface Ld2 of the edge-emitting laser diode Ld electrically contact the probes 323, the main controller C will supply power to and activate the edge-emitting laser diodes Ld. At this instant, the source measurement module M conducts a series of electrical tests, for example, measuring electrical parameters such as voltage. And, the light emission area Ldz of the edge-emitting laser diode Ld emits a laser light through the transmission cavity 22 of the base 2. The main controller C controls a test device S to measure the laser light emitted from the transmission cavity 22, thereby detecting the emission characteristics of the edge-emitting laser diode Ld. The test device S is used to monitor or detect the flux and wavelength of light by means of an integrating sphere $I_S$ and an optical sensor $P_D$.

In summary, the present invention has the following advantages and characteristics:

1. Force is applied onto the abutting block 32 through the pressing member 33, so that the abutting block 32 and the pocket 21 may jointly hold the laser diodes Ld to be tested. As such, not only accurate positioning of the laser diodes Ld is possible, but sufficient electrical contact between the laser diode Ld and the probes 323 is ensured. Also, the applied force is for increasing the thermal conductivity interface between the laser diode and the base.
2. The pressing member 33 would provide appropriate pressure and cushioning force and avoid the laser diodes Ld from being excessively pressed by the abutting block 32, and thus prevent the damage or breakage of the laser diodes Ld.
3. The transmission cavity 22 exposes completely the emitting surface Ld1 of the laser diode Ld, and thus the laser light emitted by the laser diode Ld may be emitted unobstructedly from the fixture assembly T for measurement.
4. It is possible to directly contact the laser diodes Ld to be tested by means of the temperature control unit 5, or contact the laser diodes Ld by other fluids for heating or cooling the laser diodes Ld. As such, high or low temperature test environment can be provided.
5. Easy to operate. Simply align the insertion slot 42 of the upper cover 3 with the latch post 41 of the base 2, and directly engage the upper cover 3 with the base 2 to complete locking. When the test is completed, simply press the button 34 on the upper cover 3 to disengage the upper cover 3 from the base 2.
6. The laser diodes are well protected as they are placed in the fixture assembly, and the chances of contact between the precision dies and the external devices are reduced, thereby avoids the dies from being damaged by any external forces.
7. The fixture assembly is compatible for different processes or equipments. For example, when performing different inspection items, the laser diodes do not need to be removed from the fixture, and the fixture components can be reused.

The preferred embodiments of the present invention are illustrative only, and are not limited to the details disclosed in the drawings and the specification. Many changes can be made by those having ordinary skill in the art without departing from the equivalent changes and modifications made by the claims of the present invention, and should belong to the scope of the present invention.

What is claimed is:

1. A fixture assembly for testing at least one edge-emitting laser diode, comprising:
    a base having at least one pocket, and at least one transmission cavity in communication with and orthogonal to the at least one pocket;
    an upper cover having a body formed with at least one through hole, at least one abutting block slidably disposed in the at least one through hole and slidable with respect to the body, and at least one compression spring disposed in the at least one through hole; the at least one abutting block includes at least one electrical contact interface; and
    a latch mechanism arranged on at least one of the base and the upper cover, and is configured to selectively connect or disconnect the upper cover to or from the base;

wherein the latch mechanism is operated to connect the upper cover to the base, the least one compression spring applies a force through the at least one abutting block on the at least one edge-emitting laser diode received in the at least one pocket.

2. The fixture assembly according to claim 1, wherein the latch mechanism having at least one latch post extending upwardly from an upper surface of the base, at least one insertion slot arranged on the upper cover, and at least one latch member disposed in the insertion slot for securing the at least one latch post.

3. The fixture assembly according to claim 2, wherein the at least one latch member includes a clamping block and a biasing spring, the insertion slot is provided with a receiving slot for receiving the clamping block and the biasing spring, in which the biasing spring biases the clamping block, and the at least one latch post includes a notch, the latch mechanism is operated to connect the upper cover to the base, the biasing spring biases the clamping block so that the clamping block is locked between the receiving slot and the notch.

4. The fixture assembly according to claim 1, wherein the at least one through hole is provided with a locking portion, the at least one abutting block includes a stop, the at least one compression spring is arranged between the locking portion and the stop.

5. The fixture assembly according to claim 1, wherein the base further includes a temperature control unit disposed in the at least one pocket for heating or cooling the at least one edge-emitting laser diode.

6. The fixture assembly according to claim 5, wherein the temperature control unit includes a thermal pedestal disposed at the bottom of the at least one pocket and in contact with the bottom surface of the at least one edge-emitting laser diode.

7. The fixture assembly according to claim 6, wherein the at least one electrical contact interface comprises a plurality of probes disposed on a lower end face of the at least one abutting block.

8. A testing apparatus comprising:
a power supply;
a fixture assembly for testing at least one edge-emitting laser diode as claimed in claim 1, the fixture assembly being configured to receive the at least one edge-emitting laser diode;
a source measurement module; and
a main controller for electrically connecting the power supply and the source measurement module;
wherein the source measurement module is configured to activate the at least one edge-emitting laser diode, and an electrical test and optical tests of the at least one edge-emitting laser diode are undertaken by the main controller.

9. A fixture assembly for testing at least one edge-emitting laser diode comprising a contact face, and an emitting surface having a light emission area, the fixture assembly comprising:
a base having at least one pocket for receiving the at least one edge-emitting laser diode, and at least one transmission cavity in communication with and orthogonal to the at least one pocket;
an upper cover having a body, at least one abutting block having at least one electrical contact interface, and at least one compression spring, the body has at least one through hole for slidably receiving the at least one abutting block; the at least one compression spring is disposed between the body and the at least one abutting block; and
a latch mechanism disposed on at least one of the base and the upper cover, and is configured to selectively connect or disconnect the upper cover to or from the base;
wherein the latch mechanism is operated to connect the upper cover to the base, the at least one compression spring applies a force through the at least one abutting block on the contact face of the at least one edge-emitting laser diode, the contact face of the at least one edge-emitting laser diode contacts the at least one electrical contact interface, and the at least one transmission cavity of the base exposes at least a portion of the light emission area of the at least one edge-emitting laser diode.

10. The fixture assembly according to claim 9, wherein the base further includes a temperature control unit disposed in the at least one pocket for heating or cooling the at least one edge-emitting laser diode.

\* \* \* \* \*